(12) United States Patent
Xiao et al.

(10) Patent No.: US 10,931,935 B2
(45) Date of Patent: Feb. 23, 2021

(54) STRUCTURED LIGHT PROJECTION MODULE BASED ON VCSEL ARRAY LIGHT SOURCE

(71) Applicant: SHENZHEN ORBBEC CO., LTD., Guangdong (CN)

(72) Inventors: Zhenzhong Xiao, Guangdong (CN); Xing Xu, Guangdong (CN); Xu Chen, Guangdong (CN)

(73) Assignee: ORBBEC INC., Shenzhen (CN)

( * ) Notice: Subject to any disclaimer, the term of this patent is extended or adjusted under 35 U.S.C. 154(b) by 0 days.

(21) Appl. No.: 16/415,433

(22) Filed: May 17, 2019

(65) Prior Publication Data

US 2019/0273906 A1 Sep. 5, 2019

Related U.S. Application Data

(63) Continuation of application No. PCT/CN2018/071988, filed on Jan. 9, 2018.

(30) Foreign Application Priority Data

May 19, 2017 (CN) .......................... 201710359067.8

(51) Int. Cl.
*G02B 27/30* (2006.01)
*H04N 13/254* (2018.01)
(Continued)

(52) U.S. Cl.
CPC ........... *H04N 13/254* (2018.05); *G02B 27/30* (2013.01); *G02B 27/4205* (2013.01);
(Continued)

(58) Field of Classification Search
None
See application file for complete search history.

(56) References Cited

U.S. PATENT DOCUMENTS 9,030,529 B2 5/2015 Chen et al.
9,268,012 B2 2/2016 Ghosh et al.
(Continued)

FOREIGN PATENT DOCUMENTS

CN 102760234 A 10/2012
CN 104568963 A 4/2015
(Continued)

OTHER PUBLICATIONS

First Search dated Jun. 20, 2018, issued in related Chinese Application No. 201710359067.8 (1 page).
(Continued)

*Primary Examiner* — Shadan E Haghani
(74) *Attorney, Agent, or Firm* — Sheppard Millin Richter & Hampton LLP

(57) ABSTRACT

The present disclosure provides a structured light projection module comprising: a Vertical-Cavity Surface-Emitting Laser (VCSEL) array light source that includes a semiconductor substrate and at least two VCSEL sub-arrays arranged thereon. The at least two VCSEL sub-arrays include VCSEL light sources. The structured light projection module further includes a diffractive optical element (DOE) that includes at least two DOE sub-units. The DOE sub-units are respectively corresponding to the VCSEL sub-arrays and configured to project multiple copies of light beams emitted by the corresponding at least two VCSEL sub-arrays.

12 Claims, 8 Drawing Sheets

(51) Int. Cl.
  *G02B 27/42* (2006.01)
  *G02B 27/48* (2006.01)
  *H01S 5/42* (2006.01)
  *H01S 5/042* (2006.01)
  *G06T 17/00* (2006.01)
  *H01S 5/00* (2006.01)

(52) U.S. Cl.
  CPC .............. *G02B 27/48* (2013.01); *G06T 17/00* (2013.01); *H01S 5/04256* (2019.08); *H01S 5/423* (2013.01); *H01S 5/005* (2013.01)

(56) References Cited

U.S. PATENT DOCUMENTS

| | | | |
|---|---|---|---|
| 9,847,619 B2 * | 12/2017 | Chern | ........................ G06F 1/00 |
| 2012/0262553 A1 | 10/2012 | Chen et al. | |
| 2015/0316368 A1 | 11/2015 | Moench et al. | |
| 2016/0025993 A1 * | 1/2016 | Mor | ......................... G06T 7/521 362/259 |
| 2017/0374355 A1 | 12/2017 | Ko et al. | |

FOREIGN PATENT DOCUMENTS

| CN | 104798271 A | 7/2015 |
|---|---|---|
| CN | 106568396 A | 4/2017 |
| CN | 106574964 A | 4/2017 |
| CN | 107424188 A | 12/2017 |
| CN | 206805630 U | 12/2017 |
| WO | 2016/122404 A1 | 8/2016 |

OTHER PUBLICATIONS

First Office Action dated Jun. 29, 2018, issued in related Chinese Application No. 201710359067.8, with English machine translation (10 pages).

Second Office Action dated Nov. 30, 2018, issued in related Chinese Application No. 201710359067.8 (5 pages).

PCT International Search Report and the Written Opinion dated Apr. 8, 2018, issued in related International Application No. PCT/CN2018/071988 (11 pages).

PCT International Preliminary Report on Patentability dated Nov. 28, 2019, issued in related International Application No. PCT/CN2018/071988, with English machine translation (12 pages).

Supplementary Search dated Feb. 20, 2020, issued in related Chinese Application No. 201710359067.8 (1 page).

Third Office Action dated Mar. 2, 2020, issued in related Chinese Application No. 201710359067.8, with English machine translation (7 pages).

* cited by examiner

STRUCTURED LIGHT PROJECTION MODULE BASED ON VCSEL ARRAY LIGHT SOURCE

CROSS-REFERENCE TO RELATED APPLICATIONS

This is a continuation of International Application No. PCT/CN2018/071988, filed on Jan. 9, 2018, which is based on and claims priority to and benefits of Chinese Patent Application No. 201710359067.8, filed with the State Intellectual Property Office (SIPO) of the People's Republic of China on May 19, 2017. The entire contents of all of the above-identified applications are incorporated herein by reference.

TECHNICAL FIELD

The present disclosure relates to the field of optics and electronic technologies, and in particular, to a structured light projection module based on a Vertical-Cavity Surface-Emitting Laser (VCSEL) array light source.

BACKGROUND

Three-dimensional (3D) imaging, especially the 3D imaging technology applied to the field of consumer electronics, continually impacts the conventional two-dimensional (2D) imaging technology. In addition to the capability of 2D imaging on target objects, the 3D imaging technology can obtain depth information of the target objects. Functions, such as 3D scanning, scene modeling, and gesture interaction can be further implemented based on the depth information. Depth cameras, especially structured light depth cameras or time of flight (TOF) depth cameras, currently are hardware devices widely used for the 3D imaging.

Laser projection module is a core component in the depth camera. The structure and function of the laser projection module vary with respect to the type of the depth camera. For example, the projection module disclosed in patent CN201610977172A is configured to project speckle (spots & dots) patterns into the space to implement structured light depth measurement. Such a speckle structured light depth camera is also a relatively mature and widely adopted solution. With the continuous expanding of the application fields of the depth cameras, the laser projection module will be more miniaturized and have better performance.

Featuring a small size, high power, a small beam divergence angle, stable operation, and other advantages, the vertical cavity surface emitting laser (VCSEL) array light source becomes the first choice for the light source of the laser projection module of the depth camera. The VCSEL array light source can perform laser projection by arranging a plurality of VCSEL light sources on an extremely small substrate. For example, 100 or more VCSEL light sources are arranged on a 2 mm×2 mm semiconductor substrate. For the projection module of the structured light depth camera, especially the projection module based on the speckle patterns, the VCSEL provides illumination, and the arrangement form thereof also directly affects the structured light speckle patterns projecting to a target, and further affects the measurement precision and speed of the depth camera.

Most existing solutions use an irregularly arranged VCSEL array light source, in which the arrangement density thereof also affects the pattern of structured light projection. For example, compared with a densely arranged VCSEL array light source, a sparsely arranged VCSEL array light source generates a pattern with a relatively small density, and obtains a low-precision depth image. However, the precision of a depth image obtained by using a dense structured light pattern is higher. Nevertheless, the calculation time required is longer when the depth of the dense structured light pattern is calculated by using a structured light trigonometry, which reduces the frame rate of outputting the depth image. In general, in the current solutions, the precision and the frame rate of the depth image are contradictory, and it is difficult to obtain a depth image with both high precision and a high frame rate.

SUMMARY

To solve the prior-art problem that it is difficult to obtain a depth image with both high precision and a high frame rate, the present disclosure provides a structured light projection module based on a VCSEL array light source.

To solve the foregoing problem, the present disclosure uses the following technical solutions.

The present disclosure provides a structured light projection module based on a VCSEL array light source, including: a VCSEL array light source, where the VCSEL array light source includes a semiconductor substrate and at least two sets of VCSEL sub-arrays arranged on the semiconductor substrate, wherein the VCSEL sub-array includes VCSEL light sources; and a diffractive optical element (DOE), including at least two DOE sub-units which are respectively corresponding to the VCSEL sub-arrays and configured to replicate light beams emitted by light sources of the VCSEL sub-arrays at a certain multiple and then project outward.

In some embodiments, the structured light projection module based on a VCSEL array light source also includes a lens unit. The lens unit is configured to receive and collimate a light beam emitted by the VCSEL array light source or to receive a light beam projected by the DOE and emit it into the space. The lens unit is a microlens array, a lens, or a lens group.

In some embodiments, the at least two sets of VCSEL sub-arrays are independently controlled or synchronously controlled. The at least two sets of VCSEL sub-arrays have different numbers of VCSEL light sources, and their arrangement patterns are irregular and different. The at least two DOE sub-units replicate the light beams of the corresponding VCSEL sub-arrays at different multiples and then emit outward.

In some embodiments, the light beams projected by the at least two DOE sub-units have the same field of view. The structured light projection module based on a VCSEL array light source projects a sparse high-brightness structured light pattern and a dense low-brightness structured light pattern to the field of view, wherein the high-brightness structured light pattern and the low-brightness structured light pattern are interlaced.

The present disclosure also provides a depth camera, including the structured light projection module based on a VCSEL array light source according to any one of the previous embodiments, configured to project a structured light pattern into the space; an acquisition module, configured to collect the structured light pattern reflected by a target; and a processor, configured to calculate a depth image based on the structured light pattern.

The present disclosure has the following beneficial effects: a structured light projection module based on a VCSEL array light source is provided, where the structured light projection module based on a VCSEL array light source includes a VCSEL array light source comprising a semiconductor substrate and at least two sets of VCSEL sub-arrays including VCSEL light sources; and a DOE, including a plurality of DOE sub-units corresponding to the VCSEL sub-arrays. The structured light projection module can project sparse and dense speckle patterns into the space to form multiple modes of structured light patterns, and use a matching algorithm of using a large window before using a small window to obtain a depth image with both high precision and a high frame rate, so a depth camera using same is applicable to various applications.

Figure 1:
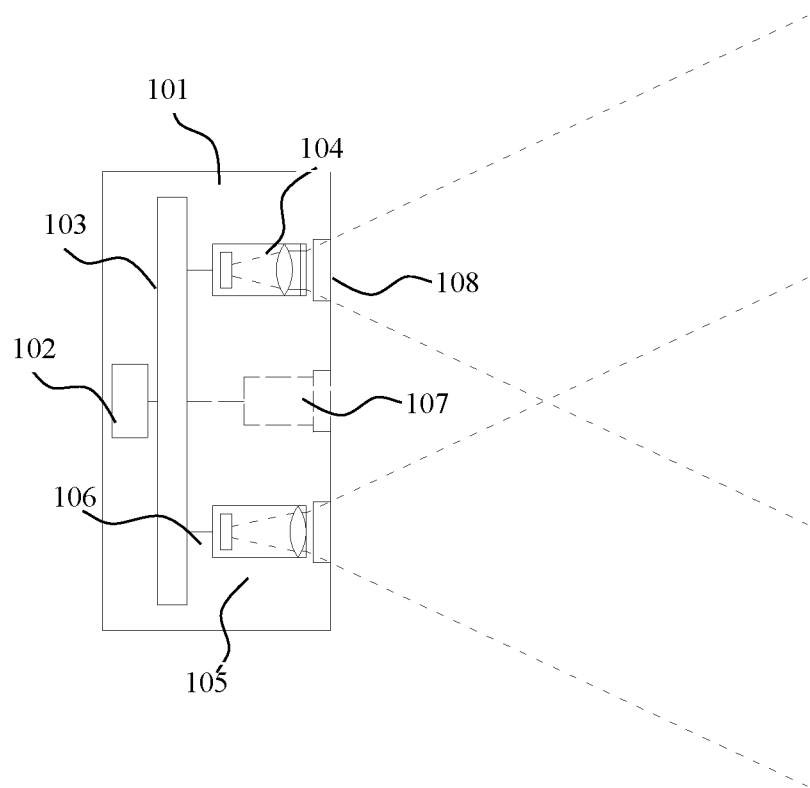
FIG. 1 is a side view of a structured light depth camera system according to an embodiment of the present disclosure.

Reference numbers shown in the drawings are listed below: 101—depth camera, 102—processor, 103—circuit board, 104—structured light projection module, 105—acquisition module, 106—interface, 107—RGB (Red, Green and Blue) camera, 108—light in/out window, 201—substrate, 202—light source, 203—lens unit, 204—speckle pattern generator, 301—VCSEL array light source, 302—sub-array, 303—another sub-array, 304—DOE, 305—DOE sub-unit, 306—another DOE sub-unit, 307—projection region, 308—speckle pattern, 309—another speckle pattern, 401—large window, 501—small window, and 601—mix speckle pattern.

DESCRIPTION OF EMBODIMENTS

The present disclosure is described in detail with reference to the accompanying drawings and specific embodiments, to better understand the present disclosure. However, the following embodiments are not intended to limit the scope of the present disclosure. In addition, it should be noted that the drawings provided in the following embodiments merely schematically illustrate the basic concept of the present disclosure, and the accompanying drawings only show components related to the present disclosure and are not drawn according to the number, shape and size of the components in actual implementation. The shape, number and proportion of the components can be randomly changed in actual implementation, and the component layout thereof can be more complicated.

FIG. 1 is a schematic side view of a structured light-based depth camera. The main components of the depth camera 101 include a structured light projection module 104, an acquisition module 105, a circuit board 103, and a processor 102. In some depth cameras, an RGB camera 107 is also provided. The structured light projection module 104, the acquisition module 105, and the RGB camera 107 are generally mounted on a fixed bracket, located on the same depth camera plane, and located on the same baseline. Each module or camera corresponds to one light in/out window 108. Generally, the processor 102 is mounted on the circuit board 103, and the structured light projection module 104 and the acquisition module 105 are respectively connected to a main board through interfaces 106. The interface can be a digital video port (DVP) interface, a Mobile Industry Processor Interface (MIPI) interface, etc. The circuit board 103 can be a Printed Circuit Board (PCB), a semiconductor substrate, etc. The structured light projection module 104 is configured to project an encoded structured light pattern into target space. The structured light image is collected by the acquisition module 105 and processed by the processor to obtain a depth image of the target space. In one embodiment, the structured light image is an infrared laser speckle pattern, and the pattern particle distribution is relatively uniform but has high local irrelevance. The local irrelevance here means that each sub-region of a pattern in a certain direction (generally referring to a direction along a connecting line between the laser projection module and the acquisition module) has a high degree of uniqueness. The corresponding acquisition module 105 is an infrared camera corresponding to the structured light projection module 104. Using the processor to obtain the depth image specifically refers to further obtaining the depth image by calculating the deviation value between the speckle pattern and a reference speckle pattern after receiving the speckle pattern collected by the acquisition module. In addition to the depth calculation, the processor 102 is configured to control the operation of each component, such as synchronously enabling the modules at specific frequency.

The depth camera shown in FIG. 1 can be an independent depth camera apparatus or an embedded depth camera. The depth camera also includes an output interface (not shown), such as a Universal Serial Bus (USB) or an MIPI. The output interface is connected to the processor for outputting the depth image to other host devices or other modules in the same device.

Structured Light Projection Module

Figure 2:
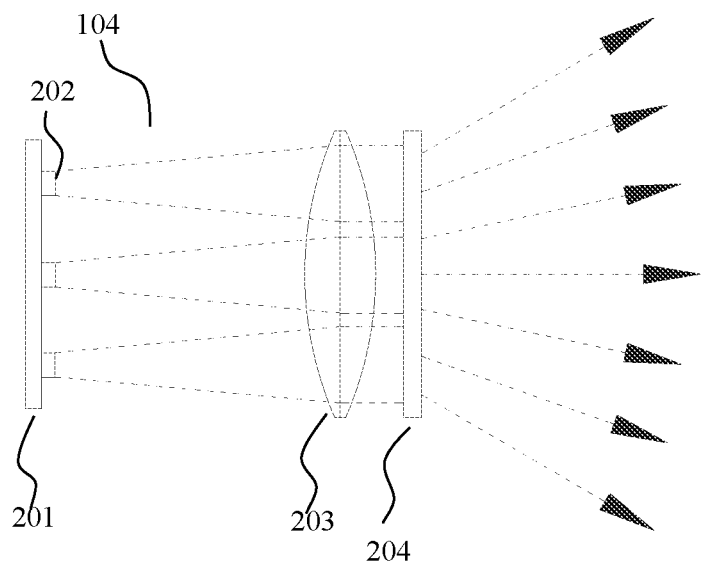
FIG. 2 is a side view of a structured light projection module according to an embodiment of the present disclosure.

FIG. 2 is an embodiment of the structured light projection module 104 of FIG. 1. The structured light projection module 104 includes a substrate 201, a light source 202, a lens 203, and a speckle pattern generator 204. The substrate 201 is usually a semiconductor substrate, such as a wafer, on which a plurality of light sources 202 is arranged. The substrate 201 and the light source 202 together form a laser array, such as a VCSEL array chip. The light source 202 includes a plurality of sub-light sources configured to emit a plurality of sub-beams. The light source can be visible light, invisible light such as infrared light or ultraviolet light source, and other laser sources. The light source can be an edge emitting laser or a VCSEL. To make the overall projection apparatus small, the optimal solution is to select a VCSEL array as the light source. In addition, different types of VCSEL array light sources can also be arranged on the same substrate, for example, the shapes, sizes, and brightness of the VCSEL array light sources can be different. In the figures, for ease of illustration, only three sub-light sources are listed in one dimension. Actually, the VCSEL array light source is two-dimensional light sources arranged in a fixed two-dimensional pattern. The VCSEL array chip can be either a bare die or a packaged chip, and the difference between them is that the bare die has a smaller size and thickness, while the packaged chip has better stability and can be more conveniently connected.

To make the pattern emitted by the structured light projection apparatus 104 have uniform and irrelevant characteristics, the arrangement pattern of the VCSEL array chip should be an irregular pattern, that is, the light sources are not arranged in a regular array, but in a certain irregular pattern. In one embodiment, the overall size of the VCSEL array chip is only on the order of millimeters (mm), such as 2 mm×2 mm, with tens or even hundreds of light sources arranged thereon, and the distances among the light sources are on the order of microns (μm), such as 30 μm.

The lens unit 203 is configured to receive light beams emitted by the VCSEL array light source 202 and converge the light beams. In one embodiment, the light beams of diverged VCSEL array light sources are collimated into parallel beams to ensure that emitted speckle energy is more concentrated. In addition to a single lens, a microlens array (MLA) can be also used in another embodiment, each microlens unit in the MLA corresponds to one light source 202, or one microlens unit corresponds to a plurality of light sources 202. In another embodiment, a lens group can also be used to achieve beam convergence.

The speckle pattern generator 204 is configured to receive the lens beam and emit a light beam capable of forming a speckle pattern. In one embodiment, the speckle pattern generator 204 is a diffractive optical element (DOE), which acts as a beam splitter. For example, when the number of light sources 202 is 100, 100 light beams will be transmitted to the DOE via the lens. Then the DOE can expand the lens beams at a certain number of multiples (copies) (for example, 200), and eventually emit 20,000 light beams into the space. Ideally 20,000 speckles can be seen (in some cases, speckles overlapping can occur, resulting in a decrease in the number of spots). In addition to the DOE, any other optical elements that can form speckles, such as a MLA, a grating, or a combination of optical elements, can be used.

In some embodiments, the lens unit 203 and the speckle pattern generator 204 can be produced on the same optical element to reduce the size.

Figure 3:
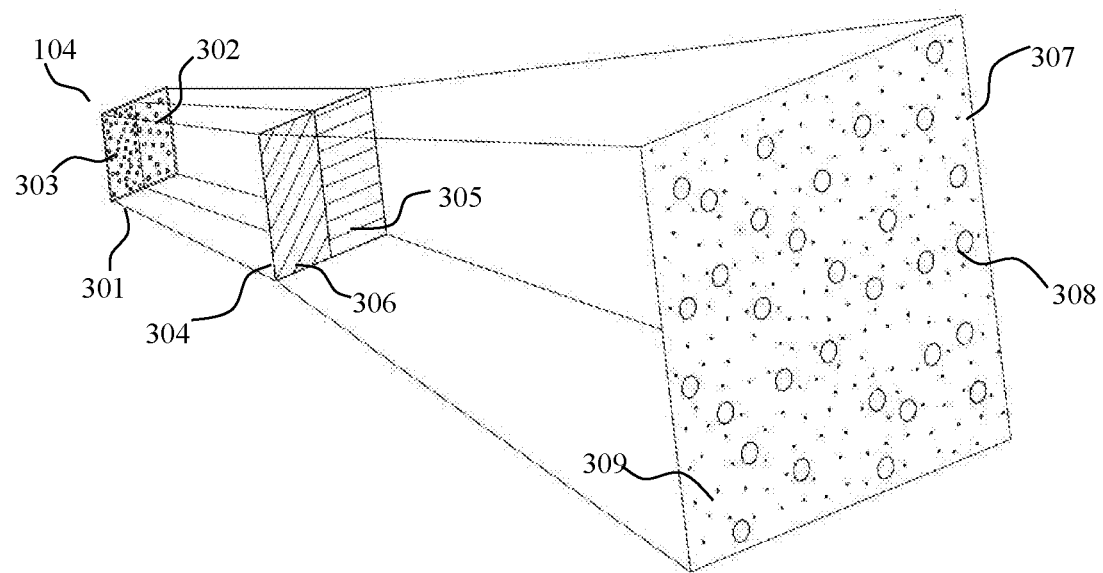
FIG. 3 is a schematic diagram of a structured light projection apparatus according to an embodiment of the present disclosure.

FIG. 3 is a schematic diagram of the structured light projection module 104 according to another embodiment of the present disclosure. Compared with FIG. 2, FIG. 3 illustrates principles of the present disclosure more intuitively. The structured light projection module 104 includes a VCSEL array light source 301 and a DOE 304. Generally, a lens is also included. For the sake of clarity, the lens is not shown in the figure. The lens can be disposed between the light source 301 and the DOE 304 for collimating light source beams, as shown in FIG. 2. In addition, the lens can also be disposed outside, that is, located on the side of the DOE 304 facing away from the light source 301. In this case, the lens has a function of projection, that is, projecting the light beams of the DOE 304 into the target space.

In this embodiment, the VCSEL array light source 301 is formed by arranging a plurality of VCSEL light sources in an irregular pattern on a semiconductor substrate. In addition, the VCSEL array light source 301 is divided into a sub-array 302 and another sub-array 303. The sub-arrays are separated in the space. For example, the two sub-arrays are separated left and right in the figure, and a segment line is shown in the middle part of the figure. This segment line is only for illustrative purposes, not necessarily existing in the VCSEL array light source. In other embodiments, there can be more than two sub-arrays. The sub-array 303 has more and denser VCSEL light sources than the sub-array 302. In addition, different sub-arrays can also be different in terms of wavelength, light source shape, or light-emitting power, etc.

The DOE 304 also includes a sub-unit 305 and another sub-unit 306, and the sub-units have a one-to-one correspondence to the sub-arrays. In this embodiment, the sub-unit 305 and the sub-unit 306 respectively correspond to the sub-array 302 and the sub-array 303. The sub-units separately replicate (split) light beams emitted by the corresponding sub-arrays at a certain multiple (e.g., splitting a light beam into multiple light beams) and then project the same into a spatial region. The one-to-one correspondence here refers to a correspondence between the sub-units and the light beams emitted by the corresponding sub-arrays, that is, the sub-unit 305 only splits the light beams emitted by the sub-array 302, and the sub-unit 306 only splits the light beams emitted by the sub-array 303. In FIG. 3, similar to the light source 301, the sub-unit 305 and the another sub-unit 306 are physically separated, e.g., from the right to the left, to facilitate receiving of the light beams from the sub-array 302 and the another sub-array 303. Nonetheless, it is not excluded that the DOE 304 can have other forms of physical or non-physical arrangements.

In an alternative embodiment of this embodiment, the VCSEL array light source can be a combination of a plurality of irregular pattern arrangements, and the pattern arrangements are spaced from each other at intervals. The sub-units of the DOE have a one-to-one correspondence to the light source arrangements. A projection region 307 of the structured light projection module 104 is covered by a speckle pattern 308 and another speckle pattern 309. In other words, the sub-unit 305 and the sub-unit 306 have nearly the same projection field of view, so the projected speckle patterns overlap in the projection region 307. The speckle pattern 308 and the speckle pattern 309 are formed by the sub-array 302 and the sub-array 303 via the sub-unit 305 and the another sub-unit 306, respectively. In one embodiment, the sub-array 302 is formed by irregularly arranged 50

VCSEL light sources, and the replication multiple of the corresponding DOE sub-unit 305 is 100, so the irregular arrangement pattern formed by the 50 VCSEL light sources is replicated into 100 identical irregular arrangement patterns. The 100 irregular arrangement patterns can be adjacent to or overlapped with each other to form the speckle pattern 308 according to the characteristics of the DOE 304. Theoretically, the speckle pattern 308 will contain 5,000 speckle particles. However, it is not excluded that a few particles can coincide to slightly decrease the total number when the irregular arrangement patterns are overlapped with each other. Similarly, the sub-array 303 is formed by irregularly arranged 200 VCSEL light sources, and a replication multiple of the corresponding DOE sub-unit 306 is 200, and the formed another speckle pattern 309 will contain 40,000 speckle particles. It is not excluded that a few particles can coincide to slightly decrease the total number when the irregular arrangement patterns are overlapped with each other.

If the power of the VCSEL light sources is the same, a smaller replication multiple of the DOE 304 makes higher brightness of the formed speckle pattern. In the embodiment shown in FIG. 3, the replication multiple of the DOE sub-unit 305 is less than that of the sub-unit 306. Therefore, the speckle pattern 308 will have higher brightness than the speckle pattern 309, and the higher brightness is represented by a larger circular region in FIG. 3. In an example embodiment, a replication multiple of a DOE sub-unit corresponding to a sub-array with a small number of VCSEL light sources is also small, so the speckle pattern 308 has a small density and high brightness. The speckle pattern 309 formed by a sub-array with a large number of VCSEL light sources has a high density and low brightness. The reason for this processing is that the contrast of the speckle pattern will be affected if the brightness is too high when the density is too high, thereby affecting the depth calculation precision. A further reason is that the depth calculation precision can be improved by matching calculation of multiple windows, which will be described below. In other embodiments, for a large number of VCSEL light sources, a replication multiple of a corresponding DOE sub-unit can also produce a speckle pattern with a low density and high brightness.

In one embodiment, the light-emitting power of each VCSEL light source in the sub-array 302 is higher than the power of each VCSEL light source in the sub-array 303, so the high-brightness speckle pattern 308 and the low-brightness speckle pattern 309 can also be obtained.

Figure 4:
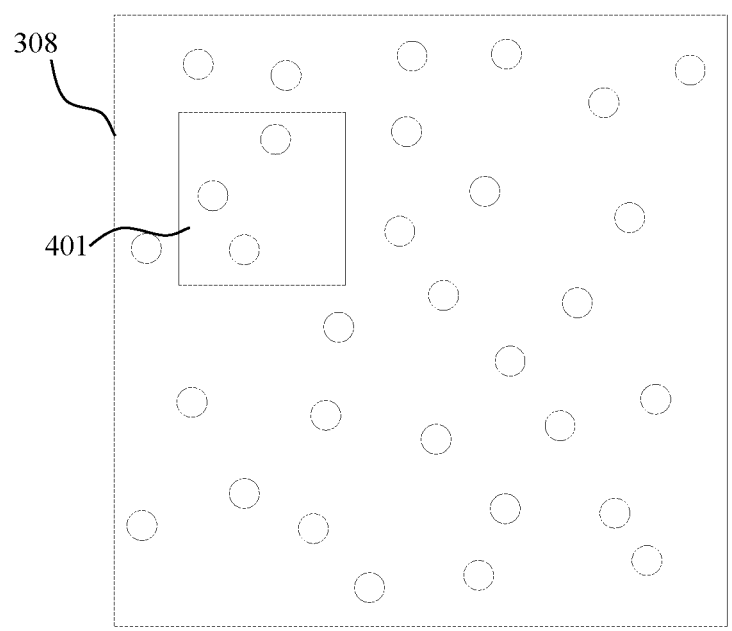
FIG. 4 is a schematic diagram of a sparse structured light pattern according to an embodiment of the present disclosure.
Figure 5:
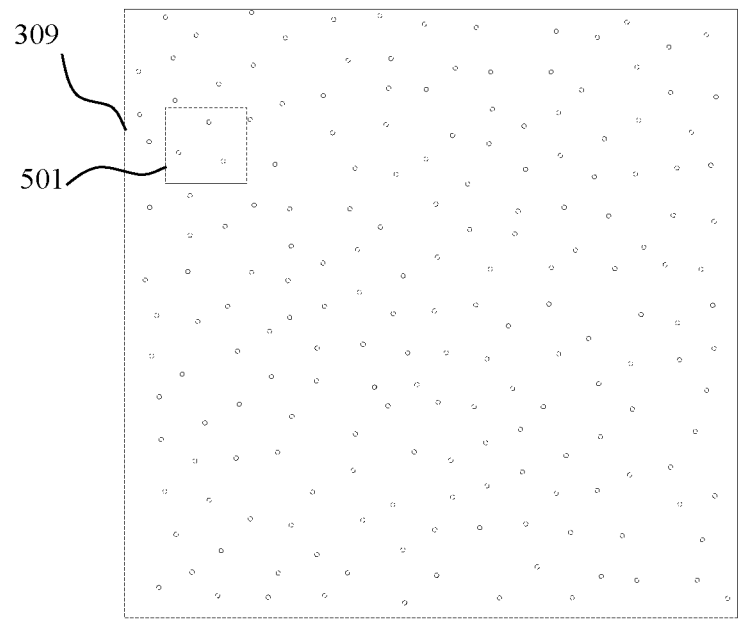
FIG. 5 is a schematic diagram of a dense structured light pattern according to an embodiment of the present disclosure.
Figure 6:
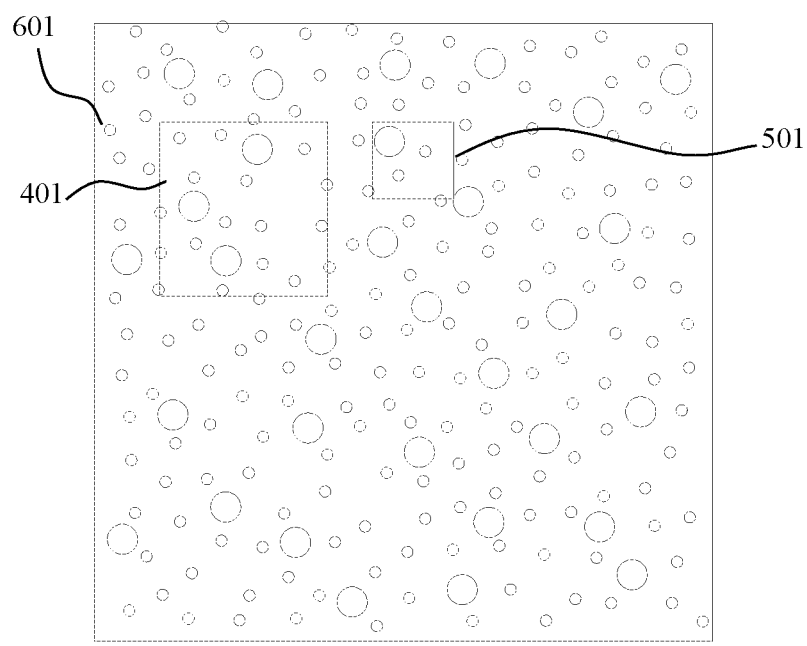
FIG. 6 is a schematic diagram of a combined structured light pattern according to an embodiment of the present disclosure.

The sub-array 302 and the sub-array 303 of the VCSEL light source can be controlled separately or synchronously. The speckle pattern in the projection area 307 is shown in FIG. 4 when only the sub-array 302 is enabled. The speckle pattern in the projection region 307 is shown in FIG. 5 when only the sub-array 303 is enabled. A mixed speckle pattern 601 can be obtained as shown in FIG. 6 when the sub-arrays 302 and 303 are simultaneously enabled.

According to the previous description, the structured light projection module 104 of the embodiment shown in FIG. 3 can operate in at least three modes, that is, the two light source sub-arrays are independently or simultaneously enabled, which can form a high-brightness but low-density speckle pattern, a low-brightness but high-density speckle pattern, and a mixed speckle pattern. These three modes can be applied to different applications. For example, for the speckle pattern shown in FIG. 5 or the mixed speckle pattern shown in FIG. 6, due to its high density, a smaller window 501 can be selected for matching calculation during depth calculation, to obtain a high-precision and high-resolution depth image. However, the disadvantage of this depth calculation method is that each pixel has to undergo multiple times of iteration to find the optimal match during the matching calculation. Generally, a smaller window indicates more times of iteration. As such, it is difficult to output a high frame-rate depth image. For the speckle pattern shown in FIG. 4, because the particles are sparse, it is necessary to select a window 401 large enough to ensure that speckle sub-patterns in the window are irrelevant. Matching calculation performed in this case is often simpler and faster, and an obtained depth image has lower precision and sometimes the resolution is also lowered.

Depth Image Calculation

With the various modes of the structured light projection module 104 in combination with the acquisition module 105, high-precision depth measurement can be implemented. Details are described below with reference to FIG. 7 to FIG. 15.

Figure 7:
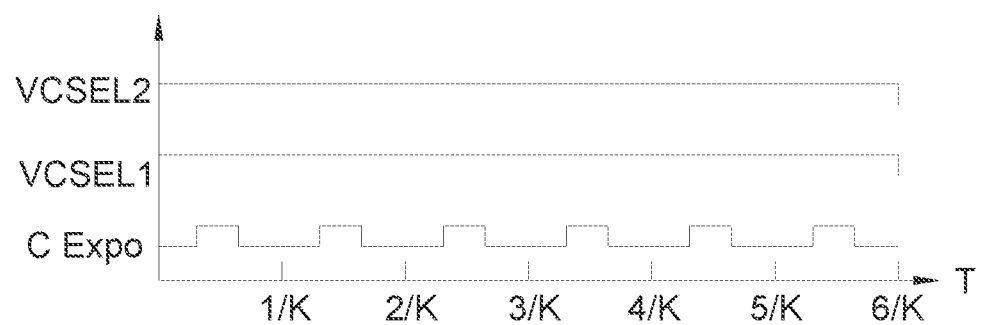
FIG. 7 is a control timing diagram of a structured light projection module and an acquisition module according to an embodiment of the present disclosure.

FIG. 7 is a control timing diagram of the structured light projection module 104 and the acquisition module 105 according to an embodiment of the present disclosure. In the figure, the horizontal coordinate represents time T, and K represents the acquisition frame rate of the acquisition module. The frame rate can also be the depth image output frame rate of a depth camera, and the time required for each frame is 1/K. For example, if K=30 fps (frames per second), the period of each frame is 1/30 s (second). In the vertical coordinate, C Expo represents the exposure time of the acquisition module, VCSEL1 and VCSEL2 respectively represent the sub-array 302 and the sub-array 303 of the VCSEL light source in the structured light projection module 104, and their respective corresponding lines represent their control timing diagrams over time. The high position represents that the camera is exposed and the VCSEL light source is turned on, and the low position represents that the VCSEL light source is turned off.

According to the timing diagram shown in FIG. 7, the acquisition module 105 is exposed during each frame period to obtain an image. The exposure time is generally smaller than the frame period, because signal transmission is also required in addition to the exposure in each frame period. In the figure, the exposure time is illustratively set in the middle of each frame period, and the exposure time can also be set at other positions.

According to the timing diagram shown in FIG. 7, the sub-array 302 and the sub-array 303 are synchronously enabled in each frame period (for example, only six frame periods are shown in the figure). Therefore, the acquisition module 105 obtains the mixed speckle pattern shown in FIG. 6 in each frame. In fact, when there is an object in the target space, the mixed speckle pattern will be modulated (or deformed) due to the existence of the object, and the deformed mixed speckle pattern will be obtained.

Figure 8:
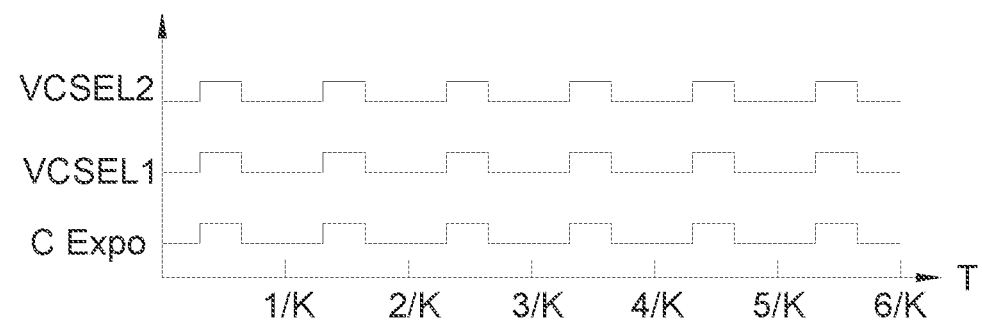
FIG. 8 is another control timing diagram of a structured light projection module and an acquisition module according to an embodiment of the present disclosure.

In the timing diagram shown in FIG. 7, the sub-array 302 and the sub-array 303 continuously emit light, but actually only need to be enabled during the exposure time of the acquisition module 105, thereby, another control situation, i.e., pulse light exists. FIG. 8 shows another control timing diagram of the structured light projection module and the acquisition module according to an embodiment of the present disclosure. During each frame period, the sub-arrays 302 and 303 synchronously emit pulses consistent with the exposure time. The duration of the two sub-array pulses should not be shorter than the exposure time, and pulse durations of different sub-arrays can be the same or different. In the case of synchronous pulse light shown in FIG. 8, the mixed speckle pattern shown in FIG. 6 is also collected by the acquisition module 105 in each frame.

Pulse light has obvious advantages compared with continuous light-emitting. On the one hand, the power consumption of pulse light is lower under the same power of light source. The pulse light can have higher power to make the light-emitting distance longer under the same power consumption, which is beneficial to improvements of measurement precision and distance. In the following embodiments, pulse light is described as an example. It can be understood that each case is also applicable to continuous light-emitting.

Figure 9:
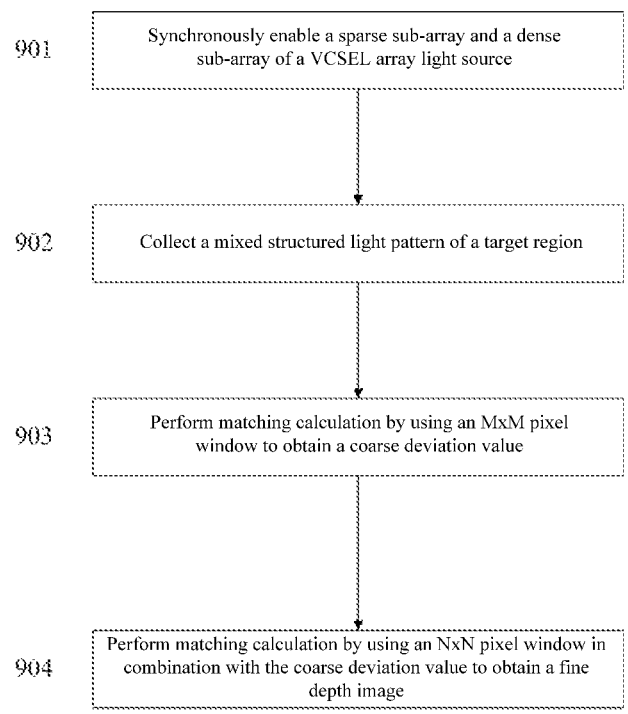
FIG. 9 is a flow chart illustrating a method for obtaining a depth image according to an embodiment of the present disclosure.

FIG. 9 is a flow chart illustrating a method for obtaining a depth image according to an embodiment of the present disclosure, which is the depth image obtaining steps in the case shown in FIG. 8. It can be understood that each step is performed by the processor 102 in the depth camera by sending a corresponding control signal or by the processor executing the program stored in the memory. The related descriptions of the processor are omitted in the following description.

In step 901, the sparse sub-array 302 and the dense sub-array 303 in the VCSEL array light source are synchronously enabled. In this case, the structured light projection module 104 projects the speckle pattern 308 and the speckle pattern 309 into the projection region 307. Synchronization here means that the sub-arrays 302 and 303 are enabled during the exposure time of each frame of the acquisition module 105. It can be understood that the enabling mode can be pulse light or continuous light.

In step 902, the acquisition module 105 obtains a mixed speckle pattern. Generally, the obtained image is a deformed mixed speckle image modulated by an object of a target.

In step 903, matching calculation is performed by using the large window 401 (M×M pixels) in FIG. 6 based on the obtained mixed speckle image. The matching calculation here refers to performing matching calculation on the mixed speckle pattern and a mixed reference speckle pattern to obtain a coarse deviation value of each or some of the pixels.

In step 904, a fine deviation value of each or some of the pixels is obtained by using the small window 501 (N×N pixels) in FIG. 6 and using the coarse deviation value as an initial search value for the matching calculation based on the collected mixed speckle image, and finally a high-precision depth value is calculated based on the fine deviation value by using the trigonometry. The depth values of some or all of the pixels constitute a depth image, which is used subsequently for ease of description.

In the previous steps, the matching speed in step 903 is faster, but the obtained deviation value is not precise. The further matching calculation is performed in step 904 to obtain a high-precision deviation value, thereby obtaining a high-precision depth image. Compared with calculation of using the small window, in this method, not only the calculation is accelerated but also the calculation precision is ensured. This is because the speckle pattern 308 ensures high irrelevance of the large window, so the matching calculation is fast and accurate. Further, the coarse deviation value obtained in the previous step is used as the initial value during the matching calculation of the small window, and the matching calculation is quickly converged to achieve high-precision calculation.

On the other hand, it is difficult to implement the depth calculation solution of first using the large window and then the small window on a dense speckle pattern with uniform brightness, such as the speckle pattern 309. The main reason is that the irrelevance of the large window will be lowered when speckle particles in the pattern are dense, and thus matching calculation of the large window is not efficient and mismatching easily occurs. However, a mixed speckle pattern can be used to implement high-efficient and high-precision measurement, because the high-brightness speckle particles in the large window 401 in FIG. 6 ensure the high irrelevance of the large window.

Figure 10:
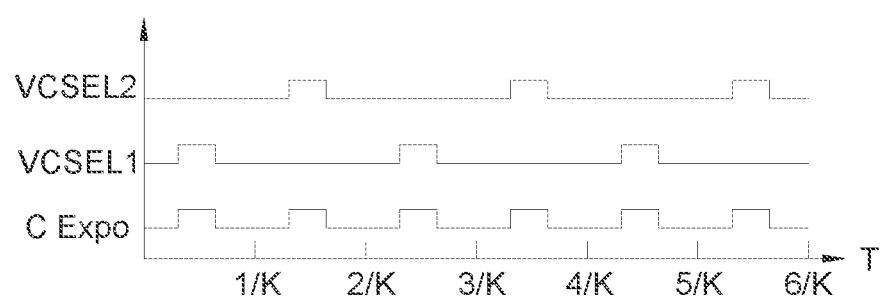
FIG. 10 is another control timing diagram of a structured light projection module and an acquisition module according to an embodiment of the present disclosure.

In addition, to further reduce the power consumption of the structured light projection module 104, the present disclosure provides another control timing diagram for alternately enabling/disabling the sub-arrays 302 and 303 at a certain frequency. FIG. 10 shows another control timing diagram of the structured light projection module and the acquisition module according to an embodiment of the present disclosure. During the first frame period of the acquisition module 105, the sub-array 302 emits a pulse during the exposure time (or continuously emits light during the period), so the sparse structured light pattern 308 shown in FIG. 4 is obtained in this frame. During the next frame period, the sub-array 303 emits a pulse during the exposure time, and in this case, the dense structured light pattern 309 shown in FIG. 5 is obtained.

Figure 11:
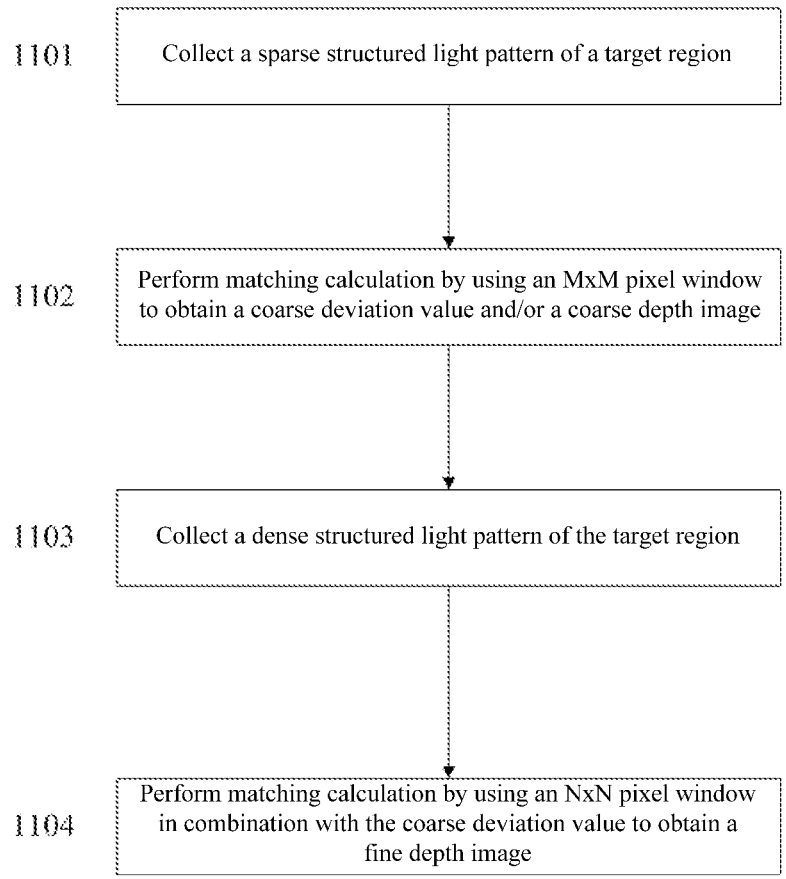
FIG. 11 is a flow chart illustrating a method for obtaining a depth image according to an embodiment of the present disclosure.

Based on control timing shown in FIG. 10, a method for obtaining the depth image performed by the depth camera is shown in FIG. 11. FIG. 11 is a flow chart illustrating a method for obtaining a depth image according to an embodiment of the present disclosure. The steps actually involve control switch on the light source sub-array, but it is clearly illustrated in the control timing diagram and is therefore omitted here for clarity.

As shown in FIG. 11, in step 1101, when only the sub-array 302 emits light, the acquisition module 105 obtains a frame of deformed sparse structured light pattern 308 modulated by a target object.

In step 1102, the depth camera performs matching calculation based on the deformed sparse structured light pattern 308 and a reference sparse speckle image, selects a sub-window M×M for matching searches to obtain a coarse pixel deviation value, and further calculates a coarse depth image by the trigonometry (the calculation principle of the trigonometry is an existing technique and is not described in detail here). In this step, due to the sparse speckle pattern, speckle particles in the window have only a few shapes, and thus the precision of the matching calculation is low, but with a very high calculation speed.

In step 1103, when only the sub-array 303 emits light, the acquisition module 105 obtains a frame of deformed dense structured light pattern 309 modulated by a target object.

In step 1104, the depth camera performs matching calculation based on the dense structured light pattern 309 and a reference dense structured light pattern, selects a sub-window N×N for matching searches, and uses the coarse deviation value obtained in step 1102 as the initial search value of the matching calculation to obtain a fine deviation value of each or some of pixels, and finally, calculates a high-precision fine depth value based on the fine deviation value by the trigonometry.

According to the embodiment shown in FIG. 11, the coarse depth image is obtained in step 1102, and the fine depth image is obtained in step 1104. Compared with the embodiment shown in FIG. 9, the frame rate of the fine depth image is halved on the premise that the frame rate of the acquisition module is the same.

Figure 12:
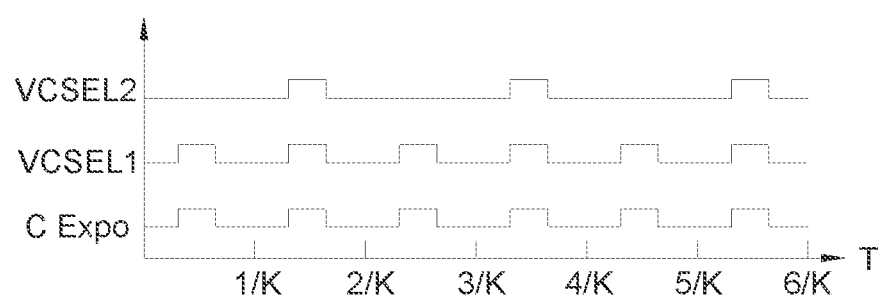
FIG. 12 is the fourth control timing diagram of a structured light projection module and an acquisition module according to an embodiment of the present disclosure.

FIG. 12 is a fourth control timing diagram of the structured light projection module and the acquisition module according to an embodiment of the present disclosure. Compared with FIG. 10, the sparse sub-array 302 emits a pulse (or continuously emits light) during each frame period of the acquisition module, while the dense sub-array 303 emits a pulse (or continuously emits light) every other frame period. Therefore, in the first frame period, the acquisition module 105 will collect the sparse structured light pattern 308. During the next frame period, the acquisition module 105 will collect a mixed structured light pattern formed by the sparse structured light pattern 308 and the dense structured light pattern 309.

Figure 13:
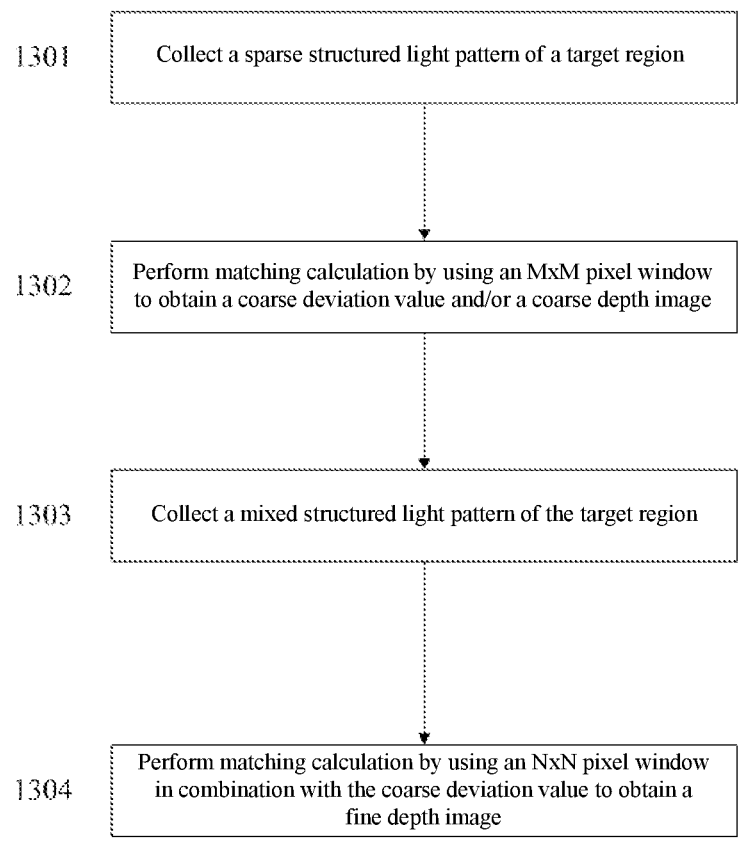
FIG. 13 is a flow chart illustrating a method for obtaining a depth image according to an embodiment of the present disclosure.

Based on the control timing shown in FIG. 12, a method of obtaining a depth image by the depth camera is shown in FIG. 13. FIG. 13 is a flow chart illustrating a method for obtaining a depth image according to an embodiment of the present disclosure.

In step 1301, when only the sub-array 302 emits light, the acquisition module 105 obtains a frame of deformed sparse structured light pattern 308 modulated by a target object.

In step 1302, the depth camera performs matching calculation based on the sparse structured light pattern 308 and a reference sparse speckle image, selects a sub-window M×M for matching search to obtain a coarse pixel deviation value, and further calculates a coarse depth image by the trigonometry.

In step 1303, when the sub-array 302 and the sub-array 303 synchronously emit light, the acquisition module 105 obtains a frame of deformed mixed structured light pattern modulated by a target object.

In step 1304, the depth camera performs matching calculation based on the mixed structured light pattern and a reference mixed structured light pattern, selects a sub-window N×N for matching searches, uses the coarse deviation value obtained in step 1302 as the initial search value of the matching calculation to obtain a fine deviation value of each or some of pixels, and finally, calculates a high-precision fine depth value based on the fine deviation value by the trigonometry.

Figure 14:
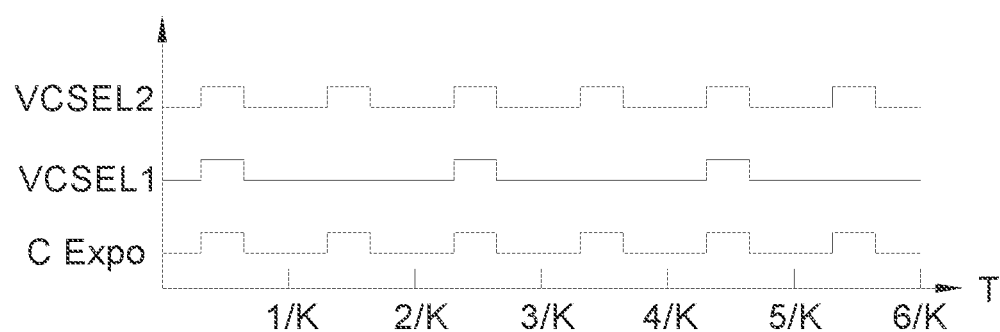
FIG. 14 is the fifth control timing diagram of a structured light projection module and an acquisition module according to an embodiment of the present disclosure.

FIG. 14 is the fifth control timing diagram of the structured light projection module and the acquisition module according to an embodiment of the present disclosure. The dense sub-array 303 emits a pulse (or continuously emits light) during each frame period of the acquisition module, while the sparse sub-array 302 emits a pulse light (or continuous light) every other frame period. Therefore, in the first frame period, the acquisition module 105 will collect a mixed structured light pattern. During the next frame period, the acquisition module 105 will collect the dense structured light pattern 309.

Figure 15:
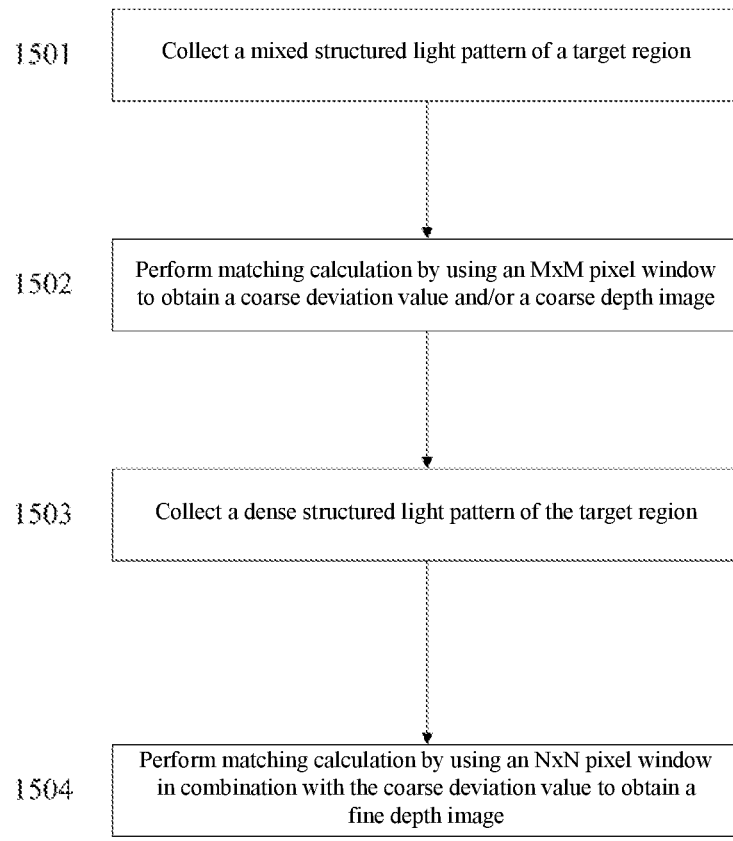
FIG. 15 is a flow chart illustrating a method for obtaining a depth image according to an embodiment of the present disclosure.

Based on the control timing shown in FIG. 14, a method for obtaining a depth image performed by the depth camera is shown in FIG. 15. FIG. 15 is a flow chart illustrating a method for obtaining a depth image according to an embodiment of the present disclosure.

In step 1501, when the sub-arrays 302 and 303 synchronously emit light, the acquisition module 105 obtains a frame of deformed mixed structured light pattern modulated by a target object.

In step 1502, the depth camera performs matching calculation based on the mixed structured light pattern and a reference mixed structured light pattern, selects a sub-window M×M for matching search to obtain a coarse pixel deviation value, and further calculates a coarse depth image according to the trigonometry.

In step 1503, when only the sub-array 303 emits light, the acquisition module 105 obtains a frame of deformed dense structured light pattern 309 modulated by a target object.

In step 1504, the depth camera performs matching calculation based on the dense structured light pattern and a reference dense structured light pattern, selects a sub-window N×N for matching search, uses the coarse deviation value obtained in step 1502 as the initial search value of the matching calculation to obtain a fine deviation value of each or some of pixels, and finally, calculates a high-precision fine depth value based on the fine deviation value by the trigonometry.

Figure 16:
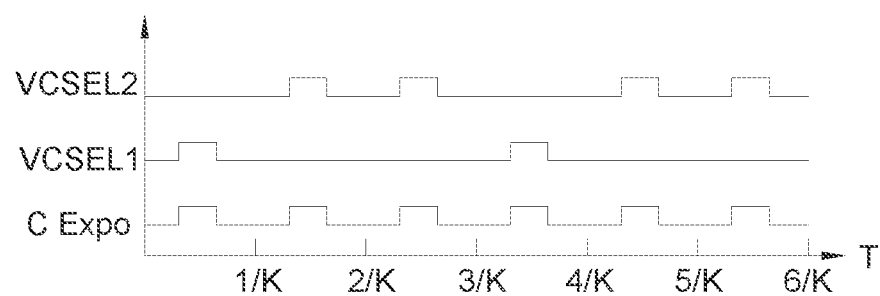
FIG. 16 is the sixth control timing diagram of a structured light projection module and an acquisition module according to an embodiment of the present disclosure.

In the embodiments shown in FIG. 10 to FIG. 15, two adjacent frames are respectively used to calculate a coarse deviation value and a fine deviation value, which is continuously repeated. A ratio of a frame number for the coarse deviation value to a frame number for the fine deviation value is 1:1 during calculation. In some embodiments, if the acquisition frame rate is high enough, the number of frames for the fine deviation value can be increased. For example, one frame is first collected for calculating the coarse deviation value, and for structured light patterns obtained in the next two or more frames, the coarse deviation value is used as the initial search value during matching calculation. FIG. 16 is the sixth control timing diagram of the structured light projection module and the acquisition module according to an embodiment of the present disclosure.

Compared with the embodiment shown in FIG. 10, the ratio of a frame number of the coarse deviation value to the fine deviation value is 1:2.

The illustrated embodiments have respective advantages and are suitable for various applications. For example, to obtain a depth image of high precision and a high frame rate, the embodiments shown in FIGS. 8 and 9 can be applied. If a high frame rate is not required and low power consumption is required, the embodiments shown in FIG. 10 to FIG. 15 can be applied. When the brightness difference of sparse sub-array and dense sub-array is too large, information about the dense part in the pattern is covered by the brightness of the sparse part when matching calculation is performed by using a mixed structured light pattern, and the embodiments shown in FIGS. 10 and 11 can be applied. When the brightness difference is not large, the embodiments shown in FIG. 12 to FIG. 15 can be applied. In some embodiments, the embodiments can be evaluated according to different applications to find the most appropriate solution.

It should be noted that in the embodiments shown in FIG. 7 to FIG. 15, the resolution can be reduced to increase the speed of obtaining the coarse deviation value, that is, the resolution is appropriately reduced at the time of calculating the coarse deviation value/depth image. In addition, during calculation of the coarse deviation value, the deviation value cannot be obtained at the edge position of the region 307 because the selected window is large. Therefore, when the coarse deviation value is adopted in the subsequent process of calculating the fine deviation value, the value can be obtained by interpolation when there is no value on some pixels. There are various interpolations, such as median, mean, and spline interpolation.

The reference structured light pattern described above is obtained as follows: A flat plate is disposed at a specified distance, the structured light projection module 104 in the depth camera projects a structured light pattern, and a structured light pattern collected by the acquisition module 105 is the reference structured light pattern. The reference sparse structured light pattern, the reference dense structured light pattern, and the reference mixed structured light pattern mentioned in the specification can be obtained by using this method. That is, they are respectively obtained by the acquisition module 105 when the structured light projection module 104 projects a sparse structured light pattern, a dense structured light pattern, and a mixed structured light pattern.

These reference structured light patterns are usually stored in the memory of the depth camera and are called by the processor during calculation.

The previous embodiments are described taking the VCSEL array light source with two sub-arrays as an example. In some embodiments, there can be three or more sub-arrays. In this case, there can be also multiple corresponding DOE sub-units and many types of working modes of the structured light projection module. However, these embodiments can all be obtained by expanding the two sub-arrays and are therefore included in the scope of the present disclosure.

The previous content is further detailed descriptions of the present disclosure by the specific example embodiments, but the present disclosure is not limited to the previous descriptions. Several equivalent substitutions or obvious variations of the same performance or usage made by a person of ordinary skill in the art without departing from the concept of the present disclosure should be included within the protection scope of the present disclosure.

What is claimed is:

1. A structured light projection module, comprising:
    a Vertical-Cavity Surface-Emitting Laser (VCSEL) array light source comprising a semiconductor substrate and at least two VCSEL sub-arrays, wherein the at least two VCSEL sub-arrays are arranged on the semiconductor substrate, and the at least two VCSEL sub-arrays include VCSEL light sources; and
    a diffractive optical element (DOE) comprising at least two DOE sub-units, wherein the at least two DOE sub-units are corresponding to the at least two VCSEL sub-arrays respectively, and the at least two DOE sub-units are configured to project multiple copies of light beams emitted by the corresponding at least two VCSEL sub-arrays,
    wherein each of the at least two DOE sub-units splits the light beams of the corresponding at least two VCSEL sub-arrays into different numbers of the split light beams and emits the split light beams outward,
    wherein the light beams respectively projected by the at least two DOE sub-units have a same field of view, and
    wherein the structured light projection module projects a sparse high-brightness structured light pattern and a dense low-brightness structured light pattern to the same field of view, and the sparse high-brightness structured light pattern and the dense low-brightness structured light pattern are interlaced.

2. The structured light projection module according to claim 1, further comprising a lens unit, wherein the lens unit is configured to receive and collimate a light beam emitted by the VCSEL array light source, or to receive a light beam projected by the DOE and emit the received light beam into a space.

3. The structured light projection module according to claim 2, wherein the lens unit includes one or more of a microlens array, a lens, or a lens group.

4. The structured light projection module according to claim 1, wherein the at least two VCSEL sub-arrays are independently controlled or synchronously controlled.

5. The structured light projection module according to claim 1, wherein the at least two VCSEL sub-arrays have different numbers of VCSEL light sources.

6. The structured light projection module according to claim 1, wherein arrangement patterns of the at least two VCSEL sub-arrays are irregular and are different.

7. A depth camera, comprising:
    a structured light projection module configured to project a structured light pattern onto a target, wherein the structured light projection module comprises:
        a Vertical-Cavity Surface-Emitting Laser (VCSEL) array light source comprising a semiconductor substrate and at least two VCSEL sub-arrays, wherein the at least two VCSEL sub-arrays are arranged on the semiconductor substrate, and the at least two VCSEL sub-arrays include VCSEL light sources; and
        a diffractive optical element (DOE) comprising at least two DOE sub-units, wherein the at least two DOE sub-units are corresponding to the at least two VCSEL sub-arrays respectively, and the at least two DOE sub-units are configured to project multiple copies of light beams emitted by the corresponding at least two VCSEL sub-arrays,
        wherein each of the at least two DOE sub-units splits the light beams of the corresponding at least two VCSEL sub-arrays into different numbers of the split light beams and emits the split light beams outward,
        wherein the light beams respectively projected by the at least two DOE sub-units have a same field of view, and
        wherein the structured light projection module projects a sparse high-brightness structured light pattern and a dense low-brightness structured light pattern to the same field of view, and the sparse high-brightness structured light pattern and the dense low-brightness structured light pattern are interlaced;
    an acquisition module configured to collect a structured light pattern reflected by the target; and
    a processor configured to calculate a depth image based on the collected structured light pattern.

8. The depth camera according to claim 7, wherein the structured light projection module further comprises a lens unit configured to receive and collimate a light beam emitted by the VCSEL array light source, or to receive a light beam projected by the DOE and emit the received light beam into a space.

9. The depth camera according to claim 8, wherein the lens unit includes one or more of a microlens array, a lens, or a lens group.

10. The depth camera according to claim 7, wherein the at least two VCSEL sub-arrays are independently controlled or synchronously controlled.

11. The depth camera according to claim 7, wherein the at least two VCSEL sub-arrays have different numbers of VCSEL light sources.

12. The depth camera according to claim 7, wherein arrangement patterns of the at least two VCSEL sub-arrays are irregular and are different.

* * * * *